United States Patent
Wyrwich et al.

(10) Patent No.: US 9,188,739 B2
(45) Date of Patent: Nov. 17, 2015

(54) COMPONENT WITH FILAMENT CONNECTION AND PROCESS FOR THE PRODUCTION OF A COMPONENT WITH FILAMENT CONNECTION

(71) Applicants: Katrin Wyrwich, Runkel (DE); Oliver Schwarzhaupt, Frankfurt (DE); Dominik Laveuve, Darmstadt (DE)

(72) Inventors: Katrin Wyrwich, Runkel (DE); Oliver Schwarzhaupt, Frankfurt (DE); Dominik Laveuve, Darmstadt (DE)

(73) Assignees: FRAUNHOFER-GESELLSCHAFT ZUR FOERDERUNG DER ANGEWANDTEN FORSCHUNG E.V., Munich (DE); TECHNISCHE UNIVERSITAT DARMSTADT, Darmstadt (DE)

( * ) Notice: Subject to any disclaimer, the term of this patent is extended or adjusted under 35 U.S.C. 154(b) by 172 days.

(21) Appl. No.: 14/022,380

(22) Filed: Sep. 10, 2013

(65) Prior Publication Data
US 2014/0072757 A1    Mar. 13, 2014

(30) Foreign Application Priority Data
Sep. 10, 2012   (DE) .................. 10 2012 216 009

(51) Int. Cl.
*G02B 6/10*   (2006.01)
*H05K 13/04*  (2006.01)
*G02B 6/38*   (2006.01)
*G02B 6/44*   (2006.01)
*G02B 6/36*   (2006.01)

(52) U.S. Cl.
CPC ............... *G02B 6/10* (2013.01); *G02B 6/3897* (2013.01); *H05K 13/04* (2013.01); *G02B 6/3608* (2013.01); *G02B 6/4475* (2013.01); *G02B 6/4495* (2013.01); *Y10T 29/49124* (2015.01); *Y10T 428/24008* (2015.01)

(58) Field of Classification Search
CPC ........................................ G02B 6/3887
USPC ....................... 428/98, 99; 385/147
See application file for complete search history.

(56) References Cited

U.S. PATENT DOCUMENTS

| 6,173,090 B1 | 1/2001 | Simon et al. |
| 2003/0068504 A1 | 4/2003 | Joseph |
| 2005/0259909 A1 | 11/2005 | Aldridge et al. |

FOREIGN PATENT DOCUMENTS

DE   10 2010 039 153   2/2012

*Primary Examiner* — Alexander Thomas
(74) *Attorney, Agent, or Firm* — Preti Flaherty Beliveau & Pachios LLP

(57) ABSTRACT

The invention relates to a component with filament connection, in particular for communication, in particular for optical communication comprising:
a voluminous material,
a substrate,
a filament and
a connection component applied on the filament,
where the filament has been embedded in the substrate and, at a transition point, emerges from the substrate and proceeds into the voluminous material. According to the invention, the voluminous material directly encloses the filament from the transition point and directly encloses the connection component applied on the filament and has full-area inseparable bonding to the substrate, where the voluminous material is a fully crosslinked voluminous material formed from a pliable material and the substrate has been hardened.

29 Claims, 5 Drawing Sheets

COMPONENT WITH FILAMENT CONNECTION AND PROCESS FOR THE PRODUCTION OF A COMPONENT WITH FILAMENT CONNECTION

The invention relates to a component with filament connection, and also to a production process for a component with filament connection.

Filaments, for example optical glass fibres, are often embedded into a substrate, for example made of a plastic or of a composite material. In order that the filaments can be connected to further components, in particular for communication, in particular for optical communication, they must emerge from the substrate at particular points. However, this transition point is particularly problematic for the filament, since even the smallest loads or movements in relation to the substrate can lead to damage to the filament.

From U.S. Pat. Nos. 6,173,090, 5,604,836 and 5,355,429 it is known that tubes, or else rigid housings, can be applied over the point of emergence of a filament to provide protection from damage, where the said tubes or housings are integrated to some extent or entirely into the laminate structure of the substrate. WO 2005/103786 likewise describes the use of a rigid housing for filament protection, and this is likewise integrated into the substrate by means of an embedding layer, where the embedding layer and the substrate can be hardened together.

A factor common to all of these components with filament protection is that because they introduce rigid structures they influence the mechanical properties of the substrate and in particular in the case of thin-walled substrates reduce the strength of the substrate as a result of crenulation effects. Incorporation of the housings by lamination moreover increases the risk of delamination of the surrounding layers, and also of the entire substrate.

It is desirable to achieve effective protection of the filament without adversely influencing the mechanical properties of the substrate or increasing the difficulty of subsequent installation of the entire component.

This is the starting point for the invention, which has the object of providing a component with filament connection, and also a production process therefor, where the filament is protected from mechanical loads and from movements in relation to the substrate not only during the production process but also during subsequent handling, and where there are no adverse effects on the mechanical properties of the substrate.

The object relating to the component with filament connection is achieved via a component according to claim 1. According to the invention, the component with filament connection, in particular for communication, in particular for optical communication, comprises the following:
  a voluminous material,
  a substrate,
  a filament and
  a connection component applied to the filament,
where the filament has been embedded in the substrate and, at a transition point, emerges from the substrate and proceeds into the voluminous material, where the voluminous material directly encloses the filament from the transition point and directly encloses the connection component applied on the filament and has full-area inseparable bonding to the substrate, where the voluminous material is a fully crosslinked voluminous material formed from a pliable material, and the substrate has been hardened.

The pliable fully crosslinked voluminous material here derives from a previously uncrosslinked or partially crosslinked pliable material, and the hardened substrate here derives from a previously unhardened substrate.

The invention also provides a production process of claim 12. According to the invention, the production process comprises the following steps:
  provision of a filament
  determination of a transition point of the filament
  application of a connection component on the filament
  application of the voluminous material in the form of a pliable non- or partially-crosslinked voluminous material
  embedment of the filament into an unhardened substrate as far as the transition point of the filament
  co-crosslinking of the substrate and of the pliable voluminous material,
where on application of the pliable non- or partially-crosslinked voluminous material the filament between connection component and transition point, and also the connection component, are directly enclosed by the voluminous material, where the filament is embedded either directly after the determination of the transition point of the filament or after the application of the pliable voluminous material, and where on co-crosslinking the pliable voluminous material is fully crosslinked and simultaneously the substrate is hardened.

It is not necessary that the process steps are carried out in the above sequence, and the embedding of the filament into the unhardened substrate can also take place prior to or after the application of the connection component on the filament.

For the purposes of this application, the term co-crosslinking denotes a process in which at least two materials are simultaneously crosslinked or hardened, and the term comprises no restrictions of any kind in relation to possible connections between the materials.

The invention is based on the idea that the use of rigid protective elements such as tubes or frameworks, in particular if they are applied only after hardening of the substrate, leads to high risk of damage to the filament specifically in the installation of the protective elements. If, as described in the prior art, the rigid protective elements are incorporated by lamination and these laminate layers are hardened with the substrate, there is the possibility of adverse influence on the mechanical properties of the substrate through crenulation effects of the protective elements, and also through delamination phenomena. Additional loads on the filament can arise when further connection components are applied on the filament, outside the protective elements.

The invention has discovered that effective filament protection can be achieved by way of a pliable voluminous material applied directly around the filament from its transition point, and also around a connection component applied on the filament, in particular when the pliable voluminous material is applied at a juncture at which the substrate is not yet hardened or when the pliable voluminous material is applied before the filament is embedded into a substrate. When a substrate has not yet hardened, the loads on the filament, not only on application of a connection component but also on application of a pliable voluminous material, are substantially smaller than when a substrate has hardened, since the filament within the unhardened substrate still has relatively large scope available for movement before it would be sheared or buckled by the load. The application of the pliable voluminous material directly around the filament and the connection component applied thereon prior to the embedding of the filament into a substrate gives improved ease of handling of the filament during the embedding process, since it is thus possible to hold the filament by way of the pliable voluminous material, without touching the actual filament. The invention has moreover discovered that by virtue of full-area inseparable bonding between the pliable voluminous material and the substrate it is possible to suppress movements of the filament in relation to the substrate while entirely, or almost entirely, eliminating crenulation effects on the substrate; delamination phenomena can also be avoided by this method. The component according to the invention, and also the production process, are therefore particularly suitable for use with thin-walled substrates.

Advantageous embodiments of the invention can be found in the dependent claims and individually provide advantageous possibilities of realizing the concept explained above in the context of the object of the invention, and also in regard of further advantages.

The location of the transition point of the filament is preferably at the surface of the substrate. This arrangement is particularly advantageous, since the edges of substrate components of this type are frequently trimmed after conclusion of the manufacturing process, and this can lead to the destruction of filaments emerging at the sides. A substrate in the form of laminate is particularly suitable.

The pliable voluminous material preferably takes the form of an elevation above a basal area on the substrate, the transition point of the filament lies within this basal area and the dimension of the basal area in at least one direction of the basal area is greater than the height of the elevation. In a particularly advantageous embodiment, in order to avoid crenulation effects, the shape of the pliable voluminous material on the basal area has no sharp edges. The basal area here can be either even or uneven.

The inseparable bond between pliable voluminous material and substrate can take various forms. A first advantageous form is direct bonding between the pliable voluminous material and the material of the substrate, either by way of adhesion mechanisms or by way of formation of a coherent bond, i.e. by way of a chemical reaction or mixture of the two materials. However, the use of an adhesive between pliable voluminous material and the substrate is also advantageous, where the adhesive provides the inseparable bond between the materials either via adhesion mechanisms at the interface of the two materials or via coherent bonding to at least one of the materials. Preference is given to the inseparable bond formed over the entire area, but the formation of the bond only in some areas is also advantageous.

An elastomer, for example rubber, has proved to be particularly suitable for use as pliable voluminous material, while the material of the substrate advantageously comprises a thermoset.

The connection component can be at a distance from the transition point of the filament.

In a particularly suitable embodiment for the further connection of the filament, the connection component is a connection plug or a push-in coupling, onto which further connection plugs can easily be assembled. The connection component can moreover be a place holder—i.e. in the form of component for filament protection—for a functional connection that can be introduced subsequently—then taking the form of functional component. An example of a functional connection that can be introduced subsequently is a fibre-optical coupling.

In an advantageous embodiment, in order to avoid any further crenulation effect, no further rigid housing structures other than the connection component have been integrated into the actual component.

The pliable voluminous material can be applied either in uncrosslinked form or in partially crosslinked form in the production process. In an advantageous embodiment, after the application of an uncrosslinked pliable voluminous material a partial-crosslinking step takes place prior to the co-crosslinking process. The uncrosslinked voluminous material can also be applied in a plurality of sub-steps with in each case a subsequent partial-crosslinking step. It is moreover advantageous to apply the pliable voluminous material in differing degrees of crosslinking, in such a way that the pliable voluminous material is applied in two sub-steps, where in the first sub-step pliable voluminous material with a first degree of partial crosslinking is applied in a way that directly encloses the filament from the transition point and that directly encloses the connection component applied to the filament, and in a second sub-step pliable voluminous material with a second degree of partial crosslinking which is lower than the first degree of partial crosslinking is applied between the voluminous material with the first degree of partial crosslinking and the substrate.

In a particularly suitable production process, during the co-crosslinking process a reaction takes place in a boundary layer between the pliable voluminous material and the material of the substrate, so that the voluminous material and the material of the substrate enter into a coherent bond. However, the development of adhesion mechanisms prior to or during the co-crosslinking process also leads to an advantageous inseparable bond. Equally, it is advantageous to apply an adhesive between pliable voluminous material and substrate prior to the co-crosslinking process, in such a way that it bonds the materials inseparably during the co-crosslinking process.

An advantage of the production of an inseparable bond during the co-crosslinking process is that after the co-crosslinking process has concluded movements of the filament in relation to the component are no longer possible and the filament has protection.

However, introduction of an adhesive after the co-crosslinking process, in particular of an adhesive which acts by way of adhesion mechanisms and does not enter into coherent bonding with the pliable voluminous material or with the material of the substrate, is also advantageous, in particular in sectors such as aircraft engineering that have particularly stringent safety requirements, since no reaction products occur here that would require separate approvals and tests.

A suitable method for the shaping in the co-crosslinking process has proved to be the use of a protective covering cap which retains the pliable voluminous material in the desired shape in the event of any possible softening thereof during the co-crosslinking process. Protective covering caps that are particularly suitable are those which ensure, for the pliable voluminous material, shapes which feature a gradual transition from the substrate surface to the pliable voluminous material and which do not form sharp edges.

Embodiments of the invention are now described below with reference to the figures. These are not necessarily intended to depict the embodiments to scale; the figures use a diagrammatic and/or slightly distorted depiction where this aids explanation. A factor to be taken into account here is that it is possible to undertake a variety of modifications and changes relating to the nature and the detail of any embodiment without deviating from the general concept of the invention. The features of the invention that are disclosed in the description, in the figures and in the claims can be of importance not only individually but also in any desired combination for embodiments of the invention. The scope of the invention also covers all combinations of at least two of the features disclosed in the description, in the figures and/or in the claims. The general concept of the invention is not limited to the precise nature or the detail of the preferred embodiments revealed and described, or limited to any subject matter that would be restricted in comparison with the subject matter claimed in the claims. Where ranges are stated, values lying within the stated limits are also intended to be disclosed as limiting values and to be amenable to claim and to use as desired. Further advantages, features and details of the invention are apparent from the following description of the preferred embodiments, and also by reference to the figures.

FIG. 1 is a diagram of an embodiment of a component with filament connection in side view (FIG. 1*a*), front view (FIG. 1*b*) and plan view (FIG. 1*c*)

FIG. 2 shows the embodiment of a component with filament connection of FIG. 1 where the connection is an optical connection, in a specific realization FIG. 3 is a diagram of various embodiments of an inseparable bond between pliable voluminous material and substrate, where FIG. 3*a* shows adhesion between voluminous material and substrate FIG. 3*b* shows a coherent bond between voluminous material and substrate FIG. 3*c* shows adhesive with adhesion to voluminous material and substrate FIG. 3*d* shows adhesive with coherent bonding to the voluminous material.

Figure 1A:
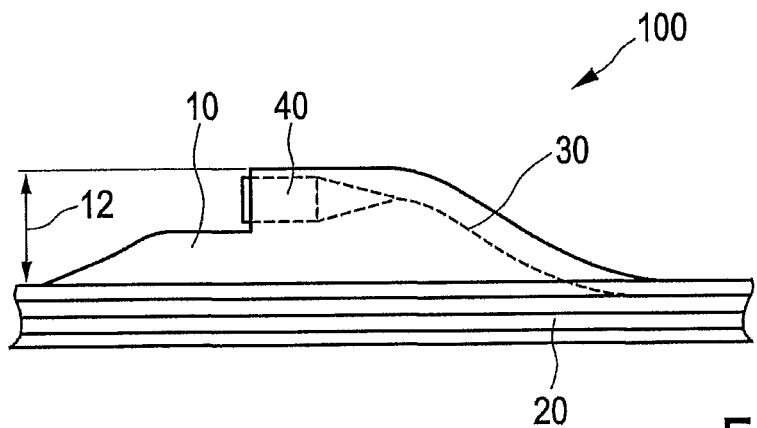
Figure 1B:
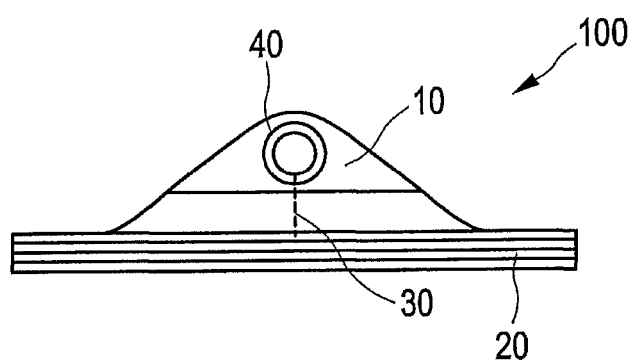
Figure 1C:
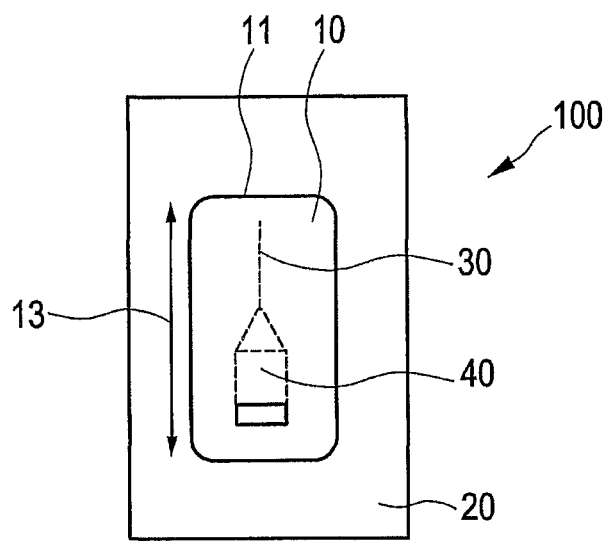

FIG. 1 is a diagram of a component 100 for filament protection. A pliable voluminous material 10 here surrounds a filament 30 emerging from a surface of a substrate 20, and also a connection component 40, applied on the filament 30. In FIG. 1*c*, the periphery 11 of the basal area of the pliable material 10 can be discerned, the dimension 13 thereof being greater than the height 12 depicted in FIG. 1*a* for the elevation which forms the pliable voluminous material. FIG. 1*a* and FIG. 1*b* moreover depict the transitions which have no sharp edges between pliable voluminous material and substrate.

Figure 2:
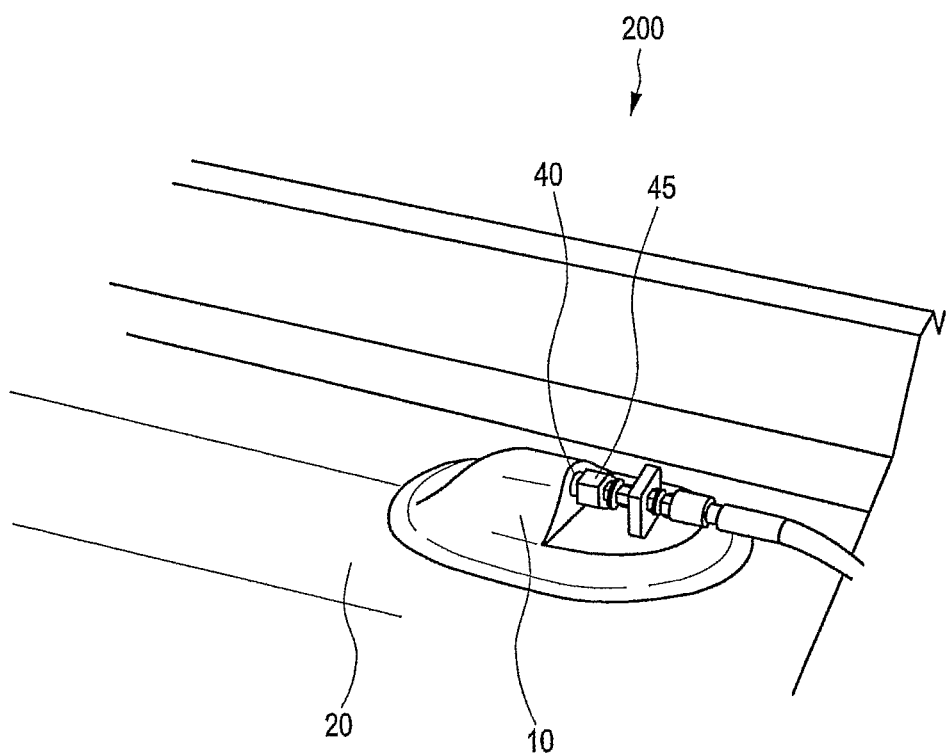
Figure 3A:
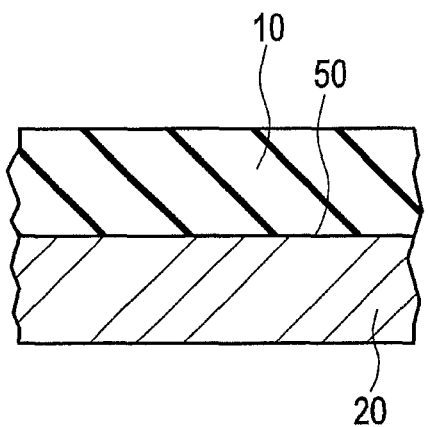
Figure 3B:
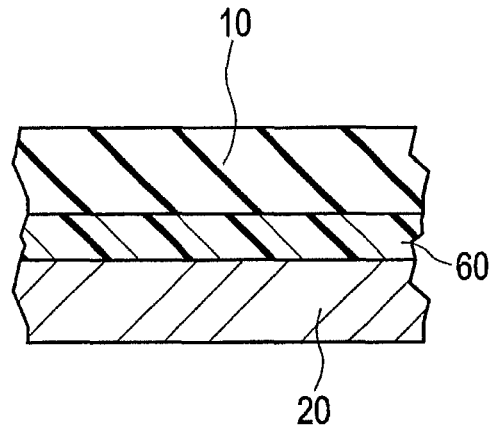
Figure 3C:
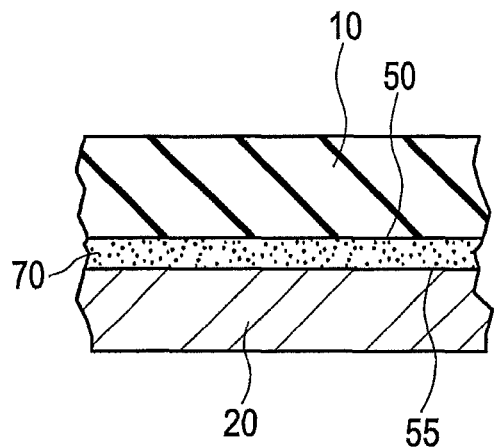
Figure 3D:
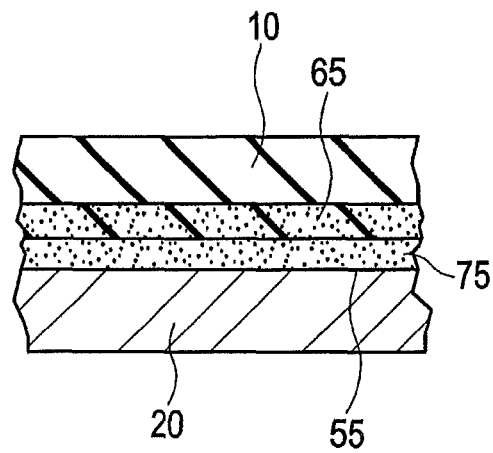

FIG. 2 shows a component 200 for filament protection, where a cable with plug 45 has been connected to the connection component 40. Here again, the transition between substrate 20 and pliable material 10 is discernible and has no sharp edges. The connection in the present case is an optical connection.

FIG. 3 illustrates the various advantageous types of inseparable bonds that can be used for the purposes of the invention. In FIG. 3*a*, the pliable voluminous material 10 and the substrate 20 form an interface 50 at which adhesion forces between the voluminous material 10 and the material of the substrate 20 are effective and lead to an inseparable bond. In contrast, FIG. 3*b* shows a coherent bond between pliable voluminous material 10 and substrate 20 where there is a boundary layer 60 which is composed at least in parts of a mixture of the two materials or of a reaction product of the two materials with one another. FIG. 3*c* depicts the use of an adhesive 17 which enters into an inseparable bond both with the voluminous material and with the substrate by virtue of the development of adhesion forces at the interfaces 50 and 55, without formation of any coherent bond. FIG. 3*d* depicts the said coherent bond between adhesive 75 and voluminous material 10 and here the adhesive 75 forms a boundary layer 65 comprising a reaction product of voluminous material 10 and adhesive 75 with one another, while it has bonding to the substrate 20 by way of adhesion forces at the interface 55.

Other advantageous embodiments include adhesives which enter into coherent bonding with both materials or else only with the substrate, while the bonding of the voluminous material is achieved by way of adhesion mechanisms.

Figure 4:
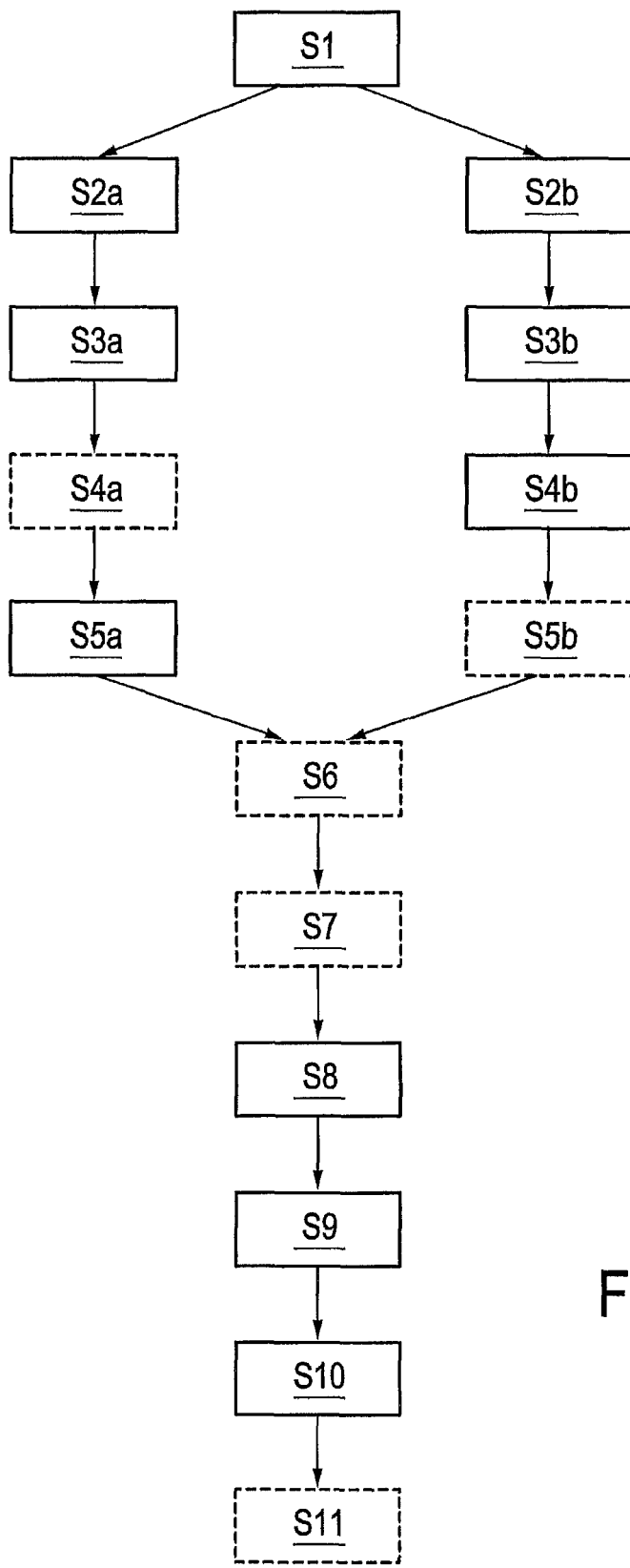
FIG. 4 shows a flow diagram of a production process for a component for filament protection.

FIG. 4 is a flow diagram of a production process for a component for filament protection. Step S1 includes the provision of a filament, and also the determination of a transition point on the filament, where the filament is intended subsequently to emerge from the substrate. In continuation, the filament can then either be embedded first in the substrate (a) in a first branch or be embedded first in the pliable material (b) in a second branch.

In the case a), the filament is first embedded, in step S2*a*, as far as the transition point into a substrate, and familiar processes can be used for this purpose, for example the use of prepregs or of semifinished fibre-matrix products or of dry fibres in an infusion process, and the substrate is not hardened here. In step S3*a*, a connection component is applied on the said filament. In step S4*a*, an adhesive can optionally be applied on the substrate, and this application can also take place prior to or after the sub-step S6. In the following step S5*a*, a pliable voluminous material is applied directly around the filament starting at the transition point, and also around the connection component.

In the case b), the connection component is first applied on the filament in step S2*b*, and then connection component and filament as far as the transition point of the filament are directly enclosed (S3*b*) with uncrosslinked or partially crosslinked pliable voluminous material, and the pliable voluminous material can optionally be partially crosslinked after the application process. The embedding of the filament into a substrate then takes place in step S4*b* by way of known processes. In step S5*b*, it is optionally then also possible to apply an adhesive between substrate and pliable voluminous material.

Not only in the first branch but also in the second branch of the process it is possible in a variant of the process to apply the pliable voluminous material in different degrees of crosslinking in the sub-step of the application of the pliable voluminous material (S5*a* and, respectively, S3*b*). This is achieved by applying the pliable voluminous material in two sub-steps, where in the first sub-step pliable voluminous material with a first degree of partial crosslinking is applied in a way that directly encloses the filament from the transition point and that directly encloses the connection component applied to the filament, and in a second sub-step pliable voluminous material with a second degree of partial crosslinking which is lower than the first degree of partial crosslinking is applied between the voluminous material with the first degree of partial crosslinking and the substrate.

Figure 5:
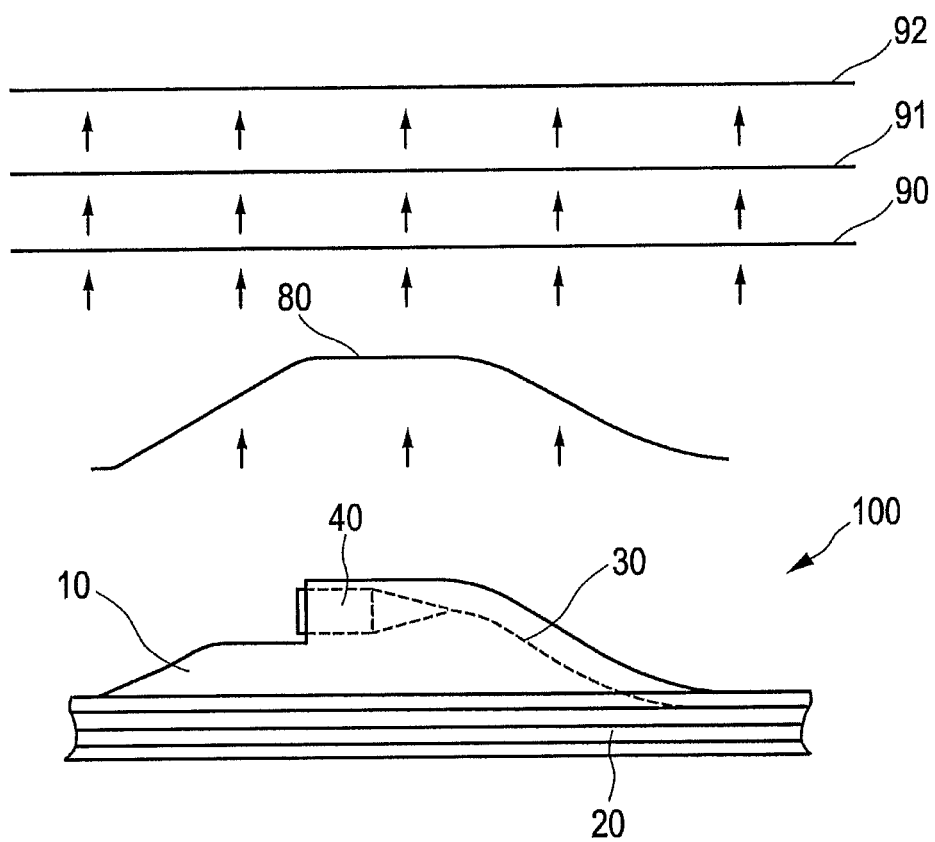
FIG. 5 is a diagram of a demoulding process after a co-crosslinking process.

Starting from step S6, the component now present made of pliable material, filament, connection component and substrate is further treated in a manner that does not depend on the prior step sequence. Step S6 here denotes a partial-crosslinking step of the pliable voluminous material and is optional. The temperature and/or duration of the said partial crosslinking step are advantageously below that for a co-crosslinking process, in order that, where appropriate, complete hardening of the substrate does not yet occur. Step S7 is the application, over the pliable voluminous material, of a protective covering cap which in the co-crosslinking process prescribes a shape for the pliable voluminous material, and is likewise optional. In step S8, as is known from the prior art for the production of laminates, a layer sequence by way of example made of a peelable membrane, a porous non-woven and a vacuum foil is used to form a package of the entire component, which is transferred into equipment for applying pressure and/or heat, for example an autoclave, an oven or a press. In step S9, a co-crosslinking process in which the pliable voluminous material is fully crosslinked and simultaneously the substrate is hardened is carried out in the said equipment, and this advantageously takes place in a heat-curing process at temperatures of from 100 to 200° C. After removal from the equipment, the component is demoulded in step S10, this step being depicted in more detail in FIG. 5. On demoulding, the vacuum foil 92 is first removed, and then the porous non-woven 91 is removed, as also is the peelable membrane 90, and within this standard process it is also advantageously possible to remove the protective covering cap 80 above the component 100. In step S11, an adhesive can optionally be applied between pliable voluminous material and substrate.

The research work that has led to these results was supported by the European Union.

The invention claimed is:

1. Component with filament connection comprising:
   a voluminous material,
   a substrate,
   a filament and
   a connection component applied to the filament,
   where the filament has been embedded in the substrate and, at a transition point, emerges from the substrate and proceeds into the voluminous material,
   characterized in that the voluminous material directly encloses the filament from the transition point and directly encloses the connection component applied on the filament and has full-area inseparable bonding to the substrate, where the voluminous material is a fully crosslinked voluminous material formed from a pliable material, and the substrate has been hardened.

2. Component according to claim 1, characterized in that the connection component is at a distance from the point at which the filament emerges from the substrate.

3. Component according to claim 1, characterized in that the transition point of the filament is on the surface of the substrate.

4. Component according to claim 1, characterized in that the pliable voluminous material takes the form of an elevation above a basal area on the substrate, the transition point of the filament lies within this basal area and the dimension of the basal area in at least one direction of the basal area is greater than the height of the elevation.

5. Component according to claim 1, characterized in that adhesion mechanisms are effective between voluminous material and hardened substrate at the interface between pliable voluminous material and hardened substrate.

6. Component according to claim 1, characterized in that between the pliable voluminous material and the hardened substrate a boundary layer has been formed in which the voluminous material and the material of the substrate have entered into a coherent bond.

7. Component according to claim 1, characterized in that between the pliable voluminous material and the hardened substrate an adhesive has been applied.

8. Component according to claim 1, characterized in that the substrate takes the form of laminate.

9. Component according to claim 1, characterized in that the material of the substrate comprises a thermoset and that the pliable voluminous material is an elastomer.

10. Component according to claim 1, where the connection component is a connection plug, a push-in coupling or a place-holder for a functional connection that can be introduced subsequently, applied at the end of the filament.

11. Component according to claim 1, characterized in that the component is free from additional rigid housing structures.

12. Process for the production of a component with filament connection according to claim 1, comprising a substrate, a filament embedded in the substrate and emerging therefrom at a transition point, a connection component applied on the filament and a voluminous material which directly encloses the filament from the transition point and also directly encloses the connection component and has full-area adhesive bonding to the substrate, characterized in that the process comprises:
   provision of the filament
   determination of a transition point of the filament
   application of the connection component on the filament
   application of the voluminous material in the form of a pliable non- or partially-crosslinked voluminous material
   embedment of the filament into an unhardened substrate as far as the transition point of the filament
   co-crosslinking of the substrate and of the pliable voluminous material,
   where on application of the pliable non- or partially-crosslinked voluminous material the filament between connection component and transition point, and also the connection component, are directly enclosed by the voluminous material, where the filament is embedded either directly after the determination of the transition point of the filament or after the application of the pliable voluminous material, and where on co-crosslinking the pliable voluminous material is fully crosslinked and simultaneously the substrate is hardened.

13. Process according to claim 12, characterized in that prior to the co-crosslinking process the pliable material undergoes a partial crosslinking process.

14. Process according to claim 13, characterized in that during the co-crosslinking process adhesion mechanisms are developed at an interface between the pliable voluminous material and the material of the substrate.

15. Process according to claim 13, characterized in that during the co-crosslinking process a reaction takes place in a boundary layer between the pliable voluminous material and the material of the substrate, so that the voluminous material and the material of the substrate enter into a cohesive bond.

16. Process according to claim 13, characterized in that prior to the co-crosslinking process an adhesive is applied between the pliable voluminous material and the substrate.

17. Process according to claim 13, characterized in that after the co-crosslinking process an adhesive is applied between the pliable voluminous material and the substrate.

18. Process according to claim 12, characterized in that during the co-crosslinking process adhesion mechanisms are developed at an interface between the pliable voluminous material and the material of the substrate.

19. Process according to claim 12, characterized in that during the co-crosslinking process a reaction takes place in a boundary layer between the pliable voluminous material and the material of the substrate, so that the voluminous material and the material of the substrate enter into a cohesive bond.

20. Process according to claim 12, characterized in that prior to the co-crosslinking process an adhesive is applied between the pliable voluminous material and the substrate.

21. Process according to claim 12, characterized in that after the co-crosslinking process an adhesive is applied between the pliable voluminous material and the substrate.

22. Process according to claims 21, characterized in that:
- in the co-crosslinking process a protective covering cap is used for the shaping of the pliable material;
- a semifinished product is provided, composed of an unhardened substrate with embedded filament; and
- the pliable voluminous material is applied in two sub-steps, where in the first sub-step pliable voluminous material with a first degree of partial crosslinking is applied in a way that directly encloses the filament from the transition point and that directly encloses the connection component applied to the filament, and in a second sub-step pliable voluminous material with a second degree of partial crosslinking which is lower than the first degree of partial crosslinking is applied between the voluminous material with the first degree of partial crosslinking and the substrate.

23. Process according to claim 12, characterized in that in the co-crosslinking process a protective covering cap is used for the shaping of the pliable material.

24. Process according to claim 12, characterized in that a semifinished product is provided, composed of an unhardened substrate with embedded filament.

25. Process according to claim 12, characterized in that the pliable voluminous material is applied in two sub-steps, where in the first sub-step pliable voluminous material with a first degree of partial crosslinking is applied in a way that directly encloses the filament from the transition point and that directly encloses the connection component applied to the filament, and in a second sub-step pliable voluminous material with a second degree of partial crosslinking which is lower than the first degree of partial crosslinking is applied between the voluminous material with the first degree of partial crosslinking and the substrate.

26. Component according to claim 1, characterized in that:
- the transition point of the filament is on the surface of the substrate;
- the pliable voluminous material takes the form of an elevation above a basal area on the substrate, the transition point of the filament lies within this basal area and the dimension of the basal area in at least one direction of the basal area is greater than the height of the elevation;
- adhesion mechanisms are effective between voluminous material and hardened substrate at the interface between pliable voluminous material and hardened substrate;
- the substrate takes the form of laminate;
- the material of the substrate comprises a thermoset and that the pliable voluminous material is an elastomer;
- the connection component is a connection plug, a push-in coupling or a place-holder for a functional connection that can be introduced subsequently, applied at the end of the filament; and
- the component is free from additional rigid housing structures.

27. Component according to claim 1, wherein the fully crosslinked voluminous material is a pliable, fully crosslinked voluminous material.

28. Component according to claim 1, wherein the filament is adapted for communication.

29. Component according to claim 28, wherein the filament adapted for communication is adapted for optical communication.

* * * * *